United States Patent [19]

Shanefield

[11] Patent Number: 4,866,501
[45] Date of Patent: Sep. 12, 1989

[54] WAFER SCALE INTEGRATION

[75] Inventor: Daniel J. Shanefield, Princeton, N.J.

[73] Assignee: American Telephone and Telegraph Company AT&T Bell Laboratories, Murray Hill, N.J.

[21] Appl. No.: 809,679

[22] Filed: Dec. 16, 1985

[51] Int. Cl.[4] .................................................. H01L 27/04
[52] U.S. Cl. ........................................ 357/50; 357/49; 357/55; 357/67; 357/68; 357/71; 357/81
[58] Field of Search ........................ 357/49, 50, 51, 55, 357/67, 71, 68, 81

[56] References Cited

U.S. PATENT DOCUMENTS

| 4,352,120 | 9/1982 | Kurihara et al. | 357/81 |
| 4,468,887 | 9/1984 | Christian et al. | 29/577 |
| 4,484,215 | 11/1984 | Pappas | 357/80 |
| 4,530,001 | 7/1985 | Mori et al. | 357/49 |

OTHER PUBLICATIONS

"The Basics of Tape Automated Bonding" by Phil W. Rima, Hybrid Circuit Technology, Nov. 1984, pp. 15-21.

*Electronics*, "Japan's Packaging Goes World Class", C. L. Cohen, 11/85, 26-31.

35th Electronic Components Conf., "Packaging Technology for the NEC SX Supercomputer", NEC Corporation, T. Watari et al., IEEE 1985, 192-198.

*Primary Examiner*—E. Wojciechowicz
*Attorney, Agent, or Firm*—Roderick B. Anderson; J. F. Spivak

[57] ABSTRACT

A circuit package comprises at least one IC chip bonded directly in a hole provided in a wafer such that the surface of the chip and the surface of the wafer are in the same plane thereby accommodating TAB bonding of the chip to bonding pads provided on the wafer. The structure can include multilayer circuitry on the wafer.

14 Claims, 1 Drawing Sheet

WAFER SCALE INTEGRATION

TECHNICAL FIELD

This invention relates to the packaging of integrated circuits. More particularly, it relates to integrated circuit packages wherein an IC chip is mounted directly on a silicon wafer.

BACKGROUND OF THE INVENTION

Various forms of packaging for intergrated circuits have been employed in the past and are presently being investigated. For example, integrated circuit chips (IC's) have been used on printed circuit boards. The printed circuit board contains circuitry for the interconnection of various integrated circuit chips with each other as well as IC's with other discrete circuit elements. Also, the printed circuit board provides means for interconnecting integrated circuits with external circuit elements and power supplies. Additionally, hybrid integrated circuits employing a ceramic substrate containing thick film conductors thereon and incorporating various discrete circuit elements have been used in the past as a means for interconnecting and packaging IC's. As the need increases for higher density and higher speed circuit packages, one must seek still other ways for packaging and interconnecting integrated circuit chips to each other and to external circuitry. To this end, I have developed a wafer scale integrated circuit configuration.

SUMMARY OF THE INVENTION

A circuit package comprises at least one integrated circuit chip mounted in a depression or hole formed in a semiconductor wafer such that there is relatively little free space between the chip and the wall forming the hole. The surface of the chip lies essentially in the same plane as the surface of the wafer. Circuit means, including bonding pads are associated with said wafer and said chip, said bonding pads being used to interconnect the circuitry associated with said wafer with the circuit on the integrated circuit chip, said interconnection being formed by a conductive foil applied by tape automated bonding.

DETAILED DESCRIPTION

Figure 1:
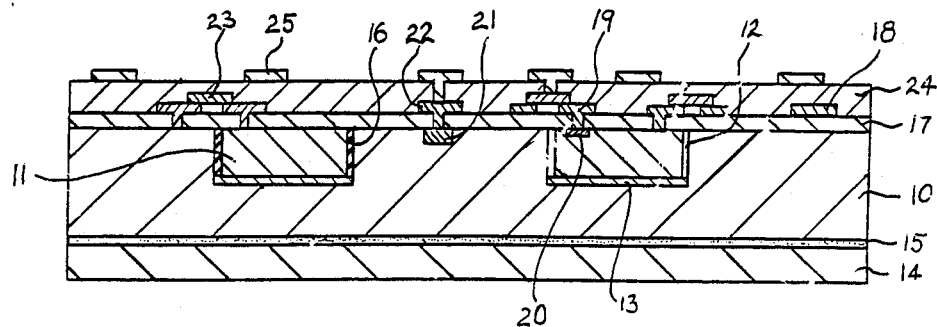
FIGS. 1-3 are elevational cross-sectional views of three embodiments of the invention, each depicting various optional features of the invention.

Referring to FIG. 1, there is shown an elevational cross-sectional view of an embodiment of the invention employing multiple interconnect layers. In accordance with FIG. 1, a semiconductor wafer 10 such as a silicon wafer or a gallium arsenide wafer, has deployed therein a plurality of integrated circuit chips 11. The integrated circuit chips 11 lie in holes 12 extending from the top surface of the wafer 10 but not through the entire wafer 10. The top surface of the integrated circuit chip 11 lies essentially in the same plane at the surface of the wafer 10. The chip 11 is bonded to the wafer 10 preferably by means of a conductive material 13 such as solder or electrically conductive epoxy. It should be noted, however, that this bonding material need not be electrically conductive in some embodiments of the invention as any adhesive layer would suffice in those applications. However, it is generally preferred that such material be thermally conductive in most embodiments. The bottom surface of the wafer 10 is preferably bonded to a support 14 by means of a second adhesive layer 15. The support 14 also may serve as a heat sink. The support 14 may be electrically conductive and/or provided with a conductive surface thereon, so as to operate as an electrical ground plane for the circuit. In such a case, the second adhesive layer 15 is preferably formed of conductive material such as solder or electrically conductive epoxy. A preferred heat sink material 14 for a silicon wafer is a colbalt-nickel-iron alloy such as Kovar, or an aluminum silicate such as mullite. The above mentioned materials exhibit coefficients of expansion close to that of silicon. Other materials, such as alumina are also suitable. When a Kovar heat sink is employed, it is also preferred that the surface of the Kovar have a thin gold layer thereon so as to enhance the bondability of the wafer 10 to the Kovar heat sink 14.

As can be seen from FIG. 1, there is a small space 16 between the chip 11 and the wafer 10 which lies in the hole formed in the wafer 10. It is preferred that this space 16 be filled with an electrical insulating material for planarization and enhanced thermal conductivity. Alumina or silica may be used for this purpose.

The surfaces of both the wafer 10 and the integrated circuit chip 11 as shown in FIG. 1 are coated with an insulating layer 17 which may be either continuous or patterned. Preferred insulating layers are photo definable polymers such as photo definable triazine and epoxy resins. When the wafer is silicon, a silicon dioxide insulating layer 17 may be employed. Conductors 18 and 19 which may be formed from an aluminum film in a manner so as to form a desired circuit pattern are provided over the insulating layer 17. Conductors 19 extend through the insulating layer 17 to the integrated circuit chip 11 so as to make contact to bonding pads 20 provided on the integrated circuit chip 11. In addition, the wafer 10 may be provided with highly doped regions 21 which form conductive paths so as to provide electrical circuitry within the surface of the wafer 10. When such highly doped regions 21 exist within the wafer 10, conductors 22 are provided over the insulating layer 17 and extend therethrough so as to make contact with the highly doped regions 21 of the wafer 10. Interconnections 23 are made between circuit elements on the wafer 10 and the integrated circuit chip 11 by means of a tape automated bonding foil. Such foils are generally comprised of gold plated copper. Such bonding is known in the industry as TAB BONDING. The means for applying such tab bonds can be found with reference to the following article which is incorporated herein by reference: "The Basics of Tape Automated Bonding" by Phil W. Rima, *Hybrid Circuit Technology*, November 1984, pages 15-21. It may be pointed out that one advantage of TAB bonding is that, in some instances, the chips can be pre-bonded to the tape so that they may be tested and burnt-in prior to mounting on the wafer. However, this is only possible where the wafer is provided with circuitry and bonding pads on its surface or over a previously formed insulating layer on the wafer prior to placing the chip and TAB bonds in place on the wafer. Such a configuration can be seen with reference to FIG. 3.

Figure 2:
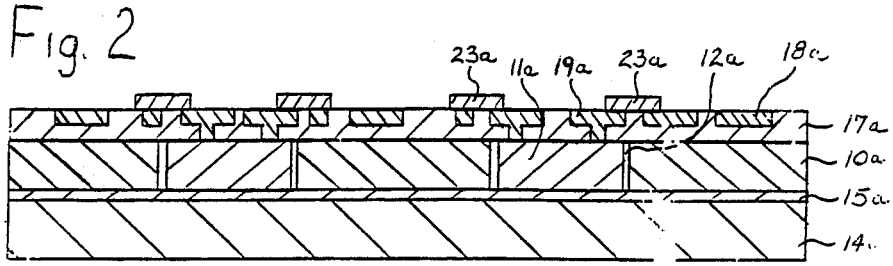

FIG. 1 shows an optional second insulating layer 24 and circuit elements 25 thereover, some of which interconnect to lower level circuit elements, e.g., 23 and 22, for example through vias through the second insulating layer 24 so as to form a multilayer circuit package. It is important to note that the novel package employs a bare IC chip mounted in a wafer without the need for a chip carrier. This feature should reduce the overall cost of the package. The device shown in FIG. 2 is substantially the same as that shown in FIG. 1 except that it only has one layer of insulation 17a and the hole 12a extends through the wafer 10a such that the chip 11a is mounted directly on the support 14a by means of the adhesive 15a. Hence, there is no need for a separate adhesive layer 13 as shown in FIG. 1. Further, the circuit elements, e.g., 18a and 19a, are shown to be formed in etched areas of the insulating layer 17a so as to provide a more planar surface for TAB bonding conductors 23a.

Figure 3:
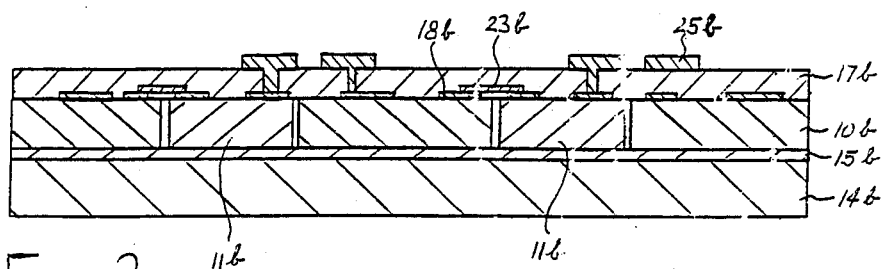

In accordance with the embodiment shown in FIG. 3, circuit elements 18b are formed directly on the surface of the semiconductor wafer 10b and are interconnected to bonding pads 19b provided on the surface of the IC chip 11b by means of TAB bonding contacts 23b. Also, in this embodiment, a single insulating layer 17b is all that is required for a two layer, multilayer circuit. Here, additional circuit elements 25b are provided over the insulating layer 17b, some of which may be coupled to bonding pads on underlying circuit elements or on the IC chip.

What is claimed is:

1. A circuit package comprising at least one integrated circuit chip affixed within a hole provided in a semiconductor wafer, the surface of the chip lying essentially in the same plane as the surface of the wafer, circuit means, including bonding pads associated with said wafer and said chip, said bonding pads used to interconnect circuitry associated with said wafer with circuitry on said chip, interconnection of said circuitry between said chip and wafer being by means of a conductive foil applied by tape automated bonding.

2. The circuit package recited in claim 1 wherein said wafer is bonded to a support.

3. The circuit package recited in claim 2 wherein said support has a thermal coefficient of expansion which approximates the thermal coefficient of expansion of the wafer.

4. The circuit package recited in claim 3 wherein the wafer is silicon and the support is selected from the group consisting of a cobalt-nickel-iron alloy and an aluminum silicate.

5. The circuit package recited in claim 2 wherein the support provides an electrical ground plane.

6. The circuit package recited in claim 2 wherein the hole in said wafer extends through the wafer and said chip is affixed to said support.

7. The circuit package recited in claim 1 wherein any space between said hole and said chip lying in said hole is filled with a heat conducting, electrically insulating material.

8. The circuit package recited in claim 1 wherein said chip is burnt-in and tested on said conductive foil prior to insertion in said hole of said wafer.

9. The circuit package recited in claim 1 including a circuit pattern diffused into the surface of said semiconductor.

10. The circuit package recited in claim 1 including a conductive pattern in contact with the surface of said wafer.

11. The circuit package recited in claim 1 including an insulating layer over the surface of said wafer and a conductive circuit pattern over said insulating layer, said circuit pattern being connected to bonding pads on said chip.

12. The circuit package recited in claim 1 including at least two layers of conductors to form circuit patterns, said layers being separated by an electrically insulating layer so as to form a multilayer circuit and including interconnection means between preselected areas of said layers and said chip.

13. The circuit package recited in claim 1 wherein bonding means for bonding said chip in place is electrically conductive.

14. The circuit package recited in claim 13 wherein said bonding means is selected from the group consisting of solder and a conductive adhesive.

* * * * *